US006667650B2

(12) United States Patent
Gammie et al.

(10) Patent No.: US 6,667,650 B2
(45) Date of Patent: Dec. 23, 2003

(54) CURRENT LEAKAGE COMPENSATION CIRCUIT AND METHOD

(75) Inventors: David A. Gammie, Tucson, AZ (US); Jeffrey B. Parfenchuck, Tucson, AZ (US); David M. Jones, Tucson, AZ (US); Jerry L. Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/266,885

(22) Filed: Oct. 8, 2002

(65) Prior Publication Data

US 2003/0184359 A1 Oct. 2, 2003

Related U.S. Application Data

(60) Provisional application No. 60/367,849, filed on Mar. 27, 2002.

(51) Int. Cl.[7] .................................................. G06G 7/12
(52) U.S. Cl. ........................................ 327/362; 327/307
(58) Field of Search ................................ 327/307, 362, 327/350–353

(56) References Cited

U.S. PATENT DOCUMENTS

| 4,613,772 | A | * | 9/1986 | Young | 326/32 |
| 5,493,246 | A | * | 2/1996 | Anderson | 327/382 |
| 5,691,657 | A | * | 11/1997 | Hirano et al. | 327/94 |
| 6,501,327 | B1 | * | 12/2002 | Tam | 327/538 |

* cited by examiner

Primary Examiner—Toan Tran
(74) Attorney, Agent, or Firm—W. Daniel Swayze, Jr.; W. James Brady; Frederick J. Telecky, Jr.

(57) ABSTRACT

A leakage compensation circuit and technique is provided that compensates for losses in a referenced current of an amplifier circuit due to leakage elements. The leakage compensation circuit is configured to inject current substantially equal in magnitude to the leakage current into one or more junctions of the amplifier circuit to compensate for lost referenced current due to leakage. As a result, the amplifier circuit and various devices can realize the flow of the reference current as substantially intended without detrimental effects of leakage current, thus maintaining the integrity of the referenced current. The leakage compensation circuit comprises an array of compensation regions configured to approximate the collective loss that is created by the leakage elements and provide a compensation current substantially equal in magnitude to one or more junctions to compensate for lost referenced current.

21 Claims, 2 Drawing Sheets

US 6,667,650 B2

CURRENT LEAKAGE COMPENSATION CIRCUIT AND METHOD

CROSS-REFERENCE TO RELATED APPLICATIONS

This application claims priority of U.S. Provisional Application No. 60/367,849, filed Mar. 27, 2002, entitled "CURRENT LEAKAGE COMPENSATION CIRCUIT."

FIELD OF INVENTION

The present invention relates to amplifier circuits. More particularly, the present invention relates to a current leakage compensation circuit and method for providing a reference current to an amplifier circuit.

BACKGROUND OF THE INVENTION

The increasing demand for higher performance amplifier circuits has resulted in the continued improvement of the precision and accuracy of the various devices and components within the amplifier circuits, as well the inclusion of additional buffers and compensation circuits.

In the implementation of various amplifier circuits, losses in the integrity of referenced currents flowing through the various devices and components can be realized. As a result, the delivered current can be possibly more or less than the intended current to the amplifier circuit. The cause of current losses can be greatly attributed to the presence of current leakage elements as well as parasitic processing components/elements occurring within the circuit devices.

The current leakage elements most often comprise diodes, created by the N and P regions, of the transistor devices within the amplifier circuit. For example, with reference to FIG. 1, a circuit 100 comprising a differential pair of transistors $Q_1$ and $Q_2$ as may be used within a logarithmic amplifier circuit are illustrated. A first reference current $I_{C1}$, is provided to the collector of transistor $Q_1$, while a second reference current $I_{C2}$ is provided to the collector of transistor $Q_2$. However, instead of currents $I_{C1}$, and $I_{C2}$ flowing through transistors $Q_1$ and $Q_2$, leakage currents $I_{LEAK1}$ and $I_{LEAK2}$ created by the $N_1/P_1$ and $N_2/P_2$ regions at the diode junctions are realized, i.e., leakage current flows from the N region into the P region. This loss of integrity in the referenced currents results in currents $I_{C1}-I_{LEAK1}$, and $I_{C2}-I_{LEAK2}$ flowing through transistors $Q_1$ and $Q_2$, which results in less accuracy during operation.

Accordingly, a need exists for addressing the leakage current resulting within devices and components of amplifier circuits.

SUMMARY OF THE INVENTION

In accordance with various aspects of the present invention, a leakage compensation circuit and technique is provided that compensates for losses in a referenced current of an amplifier circuit due to leakage elements. The leakage compensation circuit is configured to inject current substantially equal in magnitude to the leakage current into one or more junctions of the amplifier circuit to compensate for lost referenced current due to leakage. As a result, the amplifier circuit and various devices can realize the flow of the reference current as substantially intended without detrimental effects of leakage current, thus maintaining the integrity of the referenced current.

In accordance with an exemplary embodiment, the leakage compensation circuit comprises an array of compensation regions. The array of compensation regions is configured to approximate the collective loss that is created by the leakage elements and provide a compensation current substantially equal in magnitude to one or more junctions to compensate for lost referenced current. To facilitate the injecting of compensation current, the leakage compensation circuit can comprise a current mirror circuit for providing the compensation current to the amplifier circuit.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components and various processing steps. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any integrated circuit application. For purposes of illustration only, exemplary embodiments of the present invention may be described herein in connection with a logarithmic amplifier circuit. Further, it should be noted that while various components may be suitably coupled or connected to other components within exemplary circuits, such connections and couplings can be realized by direct connection between components, or by connection through other components and devices located thereinbetween.

As discussed above, leakage elements within the various components of circuits can result in losses to the intended reference currents. However, in accordance with various aspects of the present invention, a leakage compensation circuit and technique is provided that compensates for losses in a referenced current of an amplifier circuit due to leakage elements. The leakage compensation circuit is configured to inject current substantially equal in magnitude to the leakage current into one or more junctions of the amplifier circuit to compensate for referenced current loss due to leakage. As a result, the amplifier circuit and various devices can realize the flow of the reference current as substantially intended without detrimental effects of leakage current, thus maintaining the integrity of the referenced current.

Figure 2:
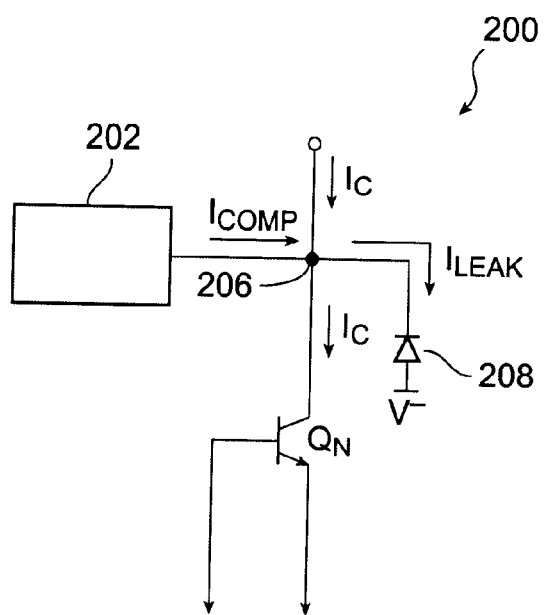
FIG. 2 illustrates an amplifier circuit configured with a leakage compensation circuit in accordance with an exemplary embodiment of the present invention.

For example, with reference to FIG. 2, a circuit 200 comprising a transistor device $Q_N$ and a leakage compensation circuit 202 is illustrated. Transistor $Q_N$ comprises an NPN bipolar transistor device, such as can be included within any amplifier circuit. A reference current $I_C$ is provided to the collector of transistor $Q_N$. Due to diode 208 created by the N and P regions at a junction 206, a leakage current $I_{LEAK}$ results in a loss of current from reference current $I_C$. However, compensation circuit 202 is configured to inject a current $I_{COMP}$ substantially equal in magnitude to leakage current $I_{LEAK}$ into junction 206 of circuit 200, e.g., at a point where reference current $I_C$ enters circuit 200, to compensate for referenced current loss due to leakage by adding an offsetting current, i.e., $I_C - I_{LEAK} + I_{COMP} = I_C$. Accordingly, circuit 200 and transistor $Q_N$ can realize the flow of reference current $I_C$ as substantially intended without detrimental effects of leakage current $I_{LEAK}$, thus maintaining the integrity of referenced current $I_C$.

Figure 3:
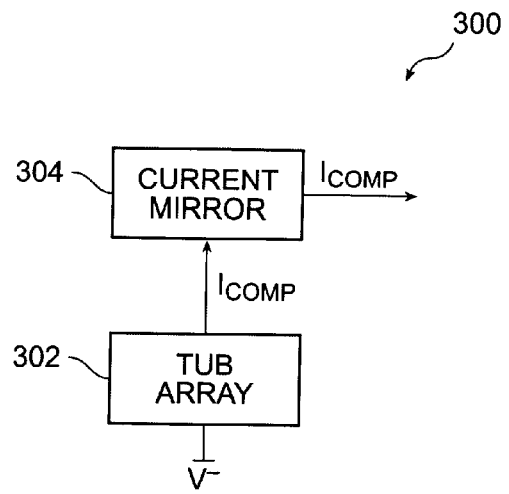
FIG. 3 illustrates a block diagram of a leakage compensation circuit in accordance with an exemplary embodiment of the present invention.

Leakage compensation circuit 202 can be configured in various manners for providing a compensation current $I_{COMP}$. For example, in accordance with an exemplary embodiment, with reference to FIG. 3, a leakage compensation circuit 300 comprises an array of compensation regions 302. Array of compensation regions 302 is configured to approximate the collective loss that is created by any leakage elements and provide a compensation current substantially equal in magnitude to the leakage current to one or more junctions to compensate for referenced current losses. Array of compensation regions 302 is configured to determine the magnitude of leakage current losses, provide an adjustable compensation current corresponding to the magnitude of leakage current losses, and then inject the compensation current into the junctions to compensate for referenced current losses.

Array of compensation regions 302 suitably comprises an array of leakage N and P regions, i.e., leakage tubs, configured to provided an adjustable compensation current $I_{COMP}$.

Array of compensation regions 302 can comprise any configuration of PN semiconductor junctions for providing a compensation current $I_{COMP}$ to compensate for referenced current losses.

To facilitate the injecting of compensation current $I_{COMP}$, leakage compensation circuit 300 can comprise a current mirror circuit 304 for delivering compensation current $I_{COMP}$ to the amplifier circuit. For example, leakage compensation circuit 300 can be configured with array of compensation regions 302 and current mirror circuit 304 for delivering compensation current $I_{COMP}$ in equal magnitudes to both node A and node B of amplifier circuit 100. Current mirror circuit 304 is coupled between array of compensation regions 302 and the junctions of the amplifier circuit where compensation is to be provided. Current mirror circuit 304 comprises one or more current mirrors configured to provide compensation current $I_{COMP}$ to one or more junctions to compensate for leakage loss resulting from one or more leakage elements. However, in addition to, or instead of, current mirror circuit 304, leakage compensation circuit 300 can comprise any circuit or device for providing compensation current $I_{COMP}$ from array of compensation regions 302 to one or more junctions to compensate for leakage loss. Moreover, leakage compensation circuit 300 can also be configured for injecting compensation current $I_{COMP}$ directly from array of compensation regions 302 to the amplifier circuit, or through any other type of circuits for coupling currents from one circuit to another.

Figure 4:
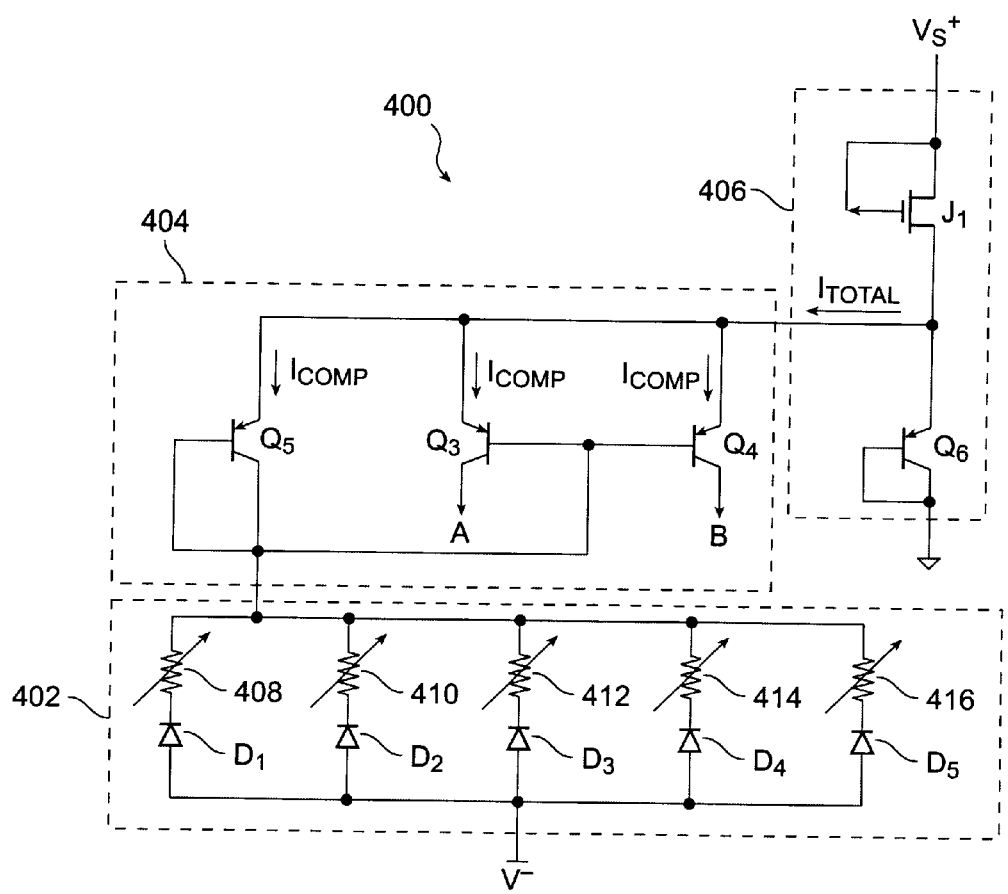
FIG. 4 illustrates a schematic diagram of a leakage compensation circuit in accordance with an exemplary embodiment of the present invention.

With reference to FIG. 4, in accordance with an exemplary embodiment, a leakage compensation circuit 400 is illustrated. Leakage compensation circuit 400 suitably comprises an array of compensation regions 402 and a current mirror circuit 404. Array of compensation regions 402 is configured to approximate the collective loss that is created by any leakage elements within the amplifier circuit and provide a compensation current substantially equal in magnitude to the leakage current. For example, array of compensation regions 402 is configured to determine the magnitude of leakage current losses, provide an adjustable compensation current corresponding to the magnitude of leakage current losses, and then inject the compensation current into the junctions to compensate for referenced current losses.

Array of compensation regions 402 suitably comprises an array of leakage N and P diode regions, i.e., leakage tubs, configured to provided an adjustable compensation current $I_{Comp}$. The array of leakage regions can comprise one or more tubs, e.g., represented as parasitic diodes $D_1$, $D_2$, $D_3$, $D_4$ and $D_5$, connected in parallel to provide the total compensation current for the compensating of the leakage loss. Any other number of compensation tubs can be included within array of compensation regions 402, for example, one tub, six tubs or more, or any number of tubs in between. In addition, parasitic diodes could be replaced with current sources, or with any type of PN semiconductor junction.

Figure 1:
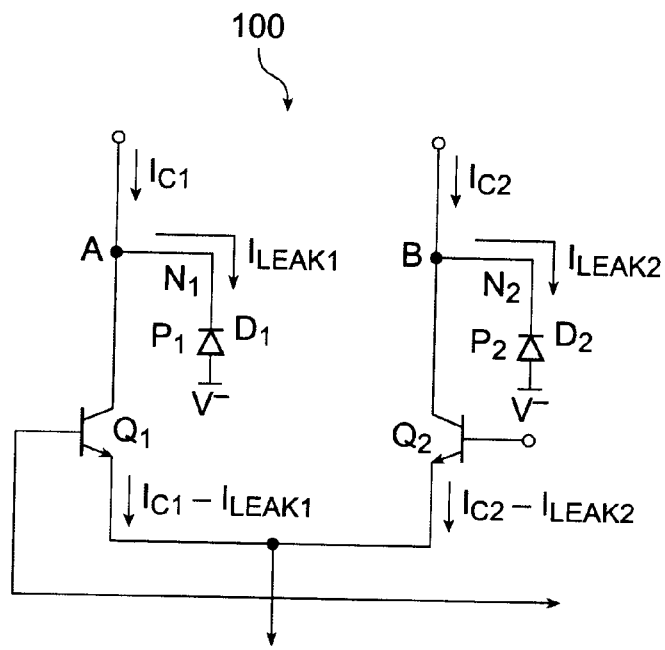
FIG. 1 illustrates a prior art amplifier circuit including leakage elements without compensation.

The compensation tubs can be configured between a negative supply V and current mirror circuit 404, e.g., representative parasitic diodes $D_1$, $D_2$, $D_3$, $D_4$ and $D_5$ can be configured with anode terminals connected to a negative supply V, and cathode terminals coupled to current mirror circuit 404. The compensation tubs can operate most effectively when the tubs are configured to individually approximate the area and perimeter of each leakage element within a circuit. For example, if used within amplifier circuit 100 of FIG. 1, a first tub $D_1$, may be configured with an area and perimeter approximate to leakage element $D_1$, of transistor device $Q_1$, while a second tub $D_2$ may be configured with an area and perimeter approximate to leakage element $D_2$ of transistor device $Q_2$.

However, additional tubs $D_3$, $D_4$ and $D_5$ could also be configured with tubs $D_1$, and $D_2$ to approximate the area and perimeter of the leakage elements. In addition, compensation tubs $D_1$, $D_2$, $D_3$, $D_4$ and $D_5$ can be suitably scaled in various other sizes to provide different amounts of compensation current. Accordingly, the parallel combination of compensation tubs $D_1$, $D_2$, $D_3$, $D_4$ and $D_5$ can be suitably configured in various manners to approximate the collective loss of current caused by leakage elements within a circuit.

To facilitate an adjustable compensation current from the array of leakage N and P diode regions, array of compensation regions 402 can comprise adjustable elements corresponding to each tub within array of compensation regions 402. For example, for compensation tubs $D_1$, $D_2$, $D_3$, $D_4$ and $D_5$, adjustable elements 408, 410, 412, 414 and 416 can be coupled between compensation tubs $D_1$, $D_2$, $D_3$, $D_4$ and $D_5$ and current mirror circuit 404, e.g., connected to the cathode terminals of compensation tubs $D_1$, $D_2$, $D_3$, $D_4$ and $D_5$.

Adjustable elements 408, 410, 412, 414 and 416 can suitably comprise a trimmable array that allows compensation tubs $D_1$, $D_2$, $D_3$, $D_4$ and $D_5$, and thus the resulting compensation current, to be suitably trimmed. In addition, adjustable elements 408, 410, 412, 414 and 416 can suitably comprise fusible links that enable compensation tubs $D_1$, $D_2$, $D_3$, $D_4$ and $D_5$ to be suitably connected and/or disconnected from array of compensation regions 402. Further, adjustable elements 408, 410, 412, 414 and 416 can suitably comprise both a trimmable and fusible array, i.e., adjustable elements 408, 410, 412, 414 and 416 can be suitably trimmed and/or connected/disconnected. Still further, adjustable elements 408, 410, 412, 414 and 416 can comprise other types of switching devices for selectively connecting and disconnecting compensation tubs $D_1$, $D_2$, $D_3$, $D_4$ and $D_5$ from array of compensation regions 402. Accordingly, adjustable elements 408, 410; 412, 414 and 416 can comprise any configuration of elements for facilitating an adjustment to the compensation current provided from array of compensation regions 402.

As a result of the parallel combination of compensation tubs $D_1$, $D_2$, $D_3$, $D_4$ and $D_5$, and the ability to suitably adjust the total amount of compensation current from array of compensation regions 402, leakage compensation circuit 400 can be suitably configured to approximate the collective loss of current caused by leakage elements within a circuit.

Current mirror circuit 404 is configured for providing the compensation current to the amplifier circuit or other circuit device effectively where current leakage has occurred. Current mirror circuit 404 is coupled between array of compensation regions 402 and the junctions of the circuit where compensation is to be provided, e.g., where a reference current enters the circuit or other device. Current mirror circuit 404 comprises one or more current mirrors configured to provide compensation current $I_{COMP}$ to one or more junctions to compensate for leakage loss resulting from one or more leakage elements.

For example, current mirror circuit 404 can comprise a diode-connected transistor $Q_5$ having a collector coupled to array of compensation regions 402 to receive total compensation current $I_{COMP}$. Total compensation current $I_{COMP}$ can be suitably mirrored by one or more transistors, e.g., transistors $Q_3$ and $Q_4$, to provide compensation current $I_{COMP}$ from the collectors of transistors $Q_3$ and $Q_4$ to the appropriate junctions. For example, for use with amplifier circuit 100 of FIG. 1, the collector of transistor $Q_3$ can be coupled to junction A of circuit 100, while the collector of transistor $Q_4$ can be coupled to junction B of circuit 100. As a result, compensation current $I_{COMP}$ can be suitably provided to circuit 100 to provide compensation for leakage currents $I_{LEAK1}$ and $I_{LEAK2}$ caused by leakage elements $D_1$, and $D_2$.

For transistors $Q_3$ and $Q_4$ comprising matched transistors, e.g., approximately matched in the size of each device, the compensation current provided by transistors $Q_3$ and $Q_4$ can comprise approximately $I_{COMP}$ each. However, in the event that a different amount of compensation current is desired for junctions A and B, transistors $Q_3$ and $Q_4$ can be suitably configured with smaller or larger sizes, i.e., smaller or larger device areas, to suitably provide a different desired amount of compensation current for junctions A and B.

Although two transistors $Q_3$ and $Q_4$ are illustrated for mirroring compensation current to the appropriate junctions, current mirror circuit 404 can comprise any other number of transistors for mirroring compensation current to any other number of junctions. In addition, although not illustrated, current mirror circuit 404 can suitably include switches in series with the collectors of transistors $Q_3$ and $Q_4$ for suitably connecting the compensation current to the appropriate junctions. Moreover, leakage compensation circuit 400 can comprise any configuration, i.e., a current mirror circuit or any other circuit, for providing compensation current $I_{COMP}$ from array of compensation regions 402 to one or more junctions to compensate for leakage loss.

To provide a source of compensation current, leakage compensation circuit 400 suitably can also comprise a current source circuit 406. In an exemplary embodiment, current source circuit 406 comprises a JFET device $J_1$, and a PNP transistor device $Q_6$. JFET device $J_1$, is configured to provide the total current $I_{TOTAL}$ provided to the emitters of transistors $Q_3$, $Q_4$ and $Q_5$. The magnitude of the currents provided from JFET device $J_1$, is determined by the configuration of array of compensation regions 402 and the mirror ratios of transistors $Q_3$, $Q_4$ and $Q_5$. JFET device $J_1$ comprises a gate and drain terminal coupled to a supply voltage $V_s^+$ and a source coupled to current mirror circuit 404. Transistor device $Q_6$ comprises a diode-connected device having an emitter coupled to the output of JFET device $J_1$, and is configured to provide or otherwise regulate an appropriate amount of voltage at the emitters of transistors $Q_3$, $Q_4$ and $Q_5$ to enable transistors $Q_3$, $Q_4$ and $Q_5$ to be maintained in the active region for correct operation. However, current source circuit 406 can comprise any other circuit configuration for providing a current source to transistors $Q_3$, $Q_4$ and $Q_5$.

Accordingly, an exemplary leakage compensation circuit is configured to inject current substantially equal in magnitude to the leakage current into one or more junctions of the amplifier circuit to compensate for referenced current loss due to leakage. The leakage compensation circuit includes an array of compensation regions configured to determine the magnitude of leakage current losses, provide an adjustable compensation current corresponding to the magnitude of leakage current losses, and then inject the compensation current into the junctions to compensate for referenced current losses. As a result, the amplifier circuit and various devices can realize the flow of the reference current as substantially intended without the detrimental effects of leakage current, thus maintaining the integrity of the referenced current.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by implementing FET devices for various of the transistor devices. Further, the various exemplary embodiments can be implemented with other types of circuits in addition to those illustrated above. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. A current leakage compensation circuit configured for compensation of leakage current within an amplifier circuit, said current leakage compensation circuit comprising:

an array of compensation regions configured for determining an amount of leakage current, for providing a compensation current for offsetting the leakage current within the amplifier circuit, and for injecting said compensation current into said amplifier circuit, said array of compensation regions comprising a plurality of leakage PN semiconductor regions, wherein said array of compensation regions comprise a plurality of PN leakage elements configured in parallel to provide said compensation current, and wherein at least one of said plurality of PN leakage elements comprise an area and perimeter approximate to an area and perimeter of a leakage element with the amplifier circuit.

2. The current leakage compensation circuit according to claim 1, wherein said current leakage compensation circuit further comprises a current mirror circuit configured for Injecting said compensation current to the amplifier circuit.

3. The current leakage compensation circuit according to claim 1, wherein said array of compensation regions comprise at least one PN leakage element configured to provide said compensation current.

4. The current leakage compensation circuit according to claim 1, wherein said array of compensation regions comprise at least one current source configured to provide said compensation current.

5. A current leakage compensation circuit configured for compensation of leakage current within an amplifier circuit, said current leakage compensation circuit comprising:
   an array of compensation regions configured for determining an amount of leakage current, for providing a compensation current for offsetting the leakage current within the amplifier circuit, and for injecting said compensation current into said amplifier circuit, said array of compensation regions comprising a plurality of leakage PN semiconductor regions,
   wherein said array of compensation regions comprise a plurality of PN leakage elements configured in parallel to provide said compensation current, and
   wherein said plurality of PN leakage elements are scaled in size to provide said compensation current.

6. A current leakage compensation circuit configured for compensation of leakage current within an amplifier circuit, said current leakage compensation circuit comprising:
   an array of compensation regions configured for determining an amount of leakage current, for providing a compensation current for offsetting the leakage current within the amplifier circuit, and for injecting said compensation current into said amplifier circuit, said array of compensation regions comprising a plurality of leakage PN semiconductor regions,
   wherein said array of compensation regions comprise at least one PN leakage element configured to provide said compensation current; and
   wherein said array of compensation regions comprise at least one adjustable element coupled in series with said at least one PN leakage element to facilitate adjustments to said compensation current.

7. The current leakage compensation circuit according to claim 6, wherein said array of compensation regions comprises a plurality of adjustable elements, each of said plurality of adjustable elements coupled in series with a corresponding one of said plurality of PN leakage elements to facilitate adjustments to said compensation current.

8. The current leakage compensation circuit according to claim 7, wherein said plurality of adjustable elements comprises a trimmable array that allows trimming of said compensation current.

9. The current leakage compensation circuit according to claim 2, wherein said current mirror circuit Is coupled between an output of said array of compensation regions and a compensation node configured with the amplifier circuit.

10. The current leakage compensation circuit according to claim 9, wherein said current mirror circuit comprises a plurality of current mirrors coupled between said output of said array of compensation regions and a plurality of compensation nodes.

11. A current leakage compensation circuit configured for compensation of leakage current within an amplifier circuit, said current leakage compensation circuit comprising:
   an array of compensation regions configured for determining an amount of leakage current, for providing a compensation current for offsetting the leakage current within the amplifier circuit, and for injecting said compensation current into said amplifier circuit, said array of compensation regions comprising a plurality of leakage PN semiconductor regions,
   wherein said current leakage compensation circuit further comprises a current mirror circuit configured for injecting said compensation current to the amplifier circuit,
   wherein said current mirror circuit is coupled between an output of said array of compensation regions and a compensation node configured with the amplifier circuit,
   wherein said current mirror circuit comprises a plurality of current mirrors coupled between said output of said array of compensation regions and a plurality of compensation nodes, and
   wherein said plurality of current mirrors are scaled with different device areas to provide different amounts of compensation current at said plurality of compensation nodes.

12. The current leakage compensation circuit according to claim 2, wherein said current leakage compensation circuit further comprises a current source compensation circuit coupled to said current mirror circuit and configured for providing a source for said compensation current.

13. The current leakage compensation circuit according to claim 12, wherein said current source compensation circuit comprises:
   a JFET device configured for providing a total current provided to said current mirror circuit; and
   a diode-connected transistor device configured to provide voltage for maintaining transistors in said current mirror circuit in an active region,
   wherein a magnitude of said total current of said JFET device is determined based on a configuration of said array of compensation regions and mirror ratios within said current mirror circuit.

14. A logarithmic amplifier circuit comprising:
   a plurality of leakage elements having a plurality of compensation junctions; and
   a current leakage compensation circuit configured for compensation of leakage current within said logarithmic amplifier circuit, said current leakage compensation circuit comprising:
      an array of compensation regions configured for providing a compensation current for offsetting said leakage current within said logarithmic amplifier circuit; and
      a current mirror circuit configured for providing said compensation current to the amplifier circuit, said current mirror circuit coupled to said plurality of compensation junctions,
      wherein said array of compensation regions comprise a plurality of parasitic diode elements configured in parallel to provide said compensation current.

15. The logarithmic amplifier circuit according to claim 14, wherein at least one of said plurality of parasitic diode elements comprise an area and perimeter approximate to an area and perimeter of at least one of said leakage elements.

16. The logarithmic amplifier circuit according to claim 14, wherein said array of compensation regions comprises a plurality of adjustable elements, each of said plurality of adjustable elements coupled in series with a corresponding one of said plurality of parasitic diode elements to facilitate adjustments to said compensation current.

17. The logarithmic amplifier circuit according to claim 16, wherein said plurality of adjustable elements comprises a trimmable array that allows trimming of said compensation current.

18. The logarithmic amplifier circuit according to claim 14, wherein said current mirror circuit comprises a plurality of current mirrors coupled between an output of said array of compensation regions and a plurality of compensation junctions.

19. A logarithmic amplifier circuit comprising:
   a plurality of leakage elements having a plurality of compensation junctions; and
   a current leakage compensation circuit configured for compensation of leakage current within said logarithmic amplifier circuit, said current leakage compensation circuit comprising:
      an array of compensation regions configured for providing a compensation current for offsetting a said leakage current within said logarithmic amplifier circuit; and
      a current mirror circuit configured for providing said compensation current to the amplifier circuit, said current mirror circuit coupled to said plurality of compensation junctions,
      wherein said current mirror circuit comprises a plurality of current mirrors coupled between an output of said array of compensation regions and a plurality of compensation junctions, and
      wherein said plurality of current mirrors are scaled with different device areas to provide different amounts of compensation current at said plurality of compensation nodes.

20. The logarithmic amplifier circuit according to claim 14, wherein said current leakage compensation circuit further comprises a current source compensation circuit coupled to said current mirror circuit and configured for providing a source for said compensation current.

21. A logarithmic amplifier circuit comprising:
   a plurality of leakage elements having a plurality of compensation junctions; and
   a current leakage compensation circuit configured for compensation of leakage current within said logarithmic amplifier circuit, said current leakage compensation circuit comprising:
      an array of compensation regions configured for providing a compensation current for offsetting said leakage current within said logarithmic amplifier circuit; and
      a current mirror circuit configured for providing said compensation current to the amplifier circuit, said current mirror circuit coupled to said plurality of compensation junctions,
   wherein said current leakage compensation circuit further comprises a current source compensation circuit coupled to said current mirror circuit and configured for providing a source for said compensation current, and
   wherein said current source compensation circuit comprises:
      a JFET device configured for providing a total current provided to said current mirror circuit, wherein a magnitude of said total current of said JFET device is determined based on a configuration of said array of compensation regions and mirror ratios within said current mirror circuit; and
      a diode-connected transistor device configured to provide voltage for maintaining transistors in said current mirror circuit in an active region.

* * * * *